US011146873B2

United States Patent
Heo et al.

(10) Patent No.: US 11,146,873 B2
(45) Date of Patent: Oct. 12, 2021

(54) DISPLAY DEVICE

(71) Applicant: LG ELECTRONICS INC., Seoul (KR)

(72) Inventors: Jinha Heo, Seoul (KR); Youngin Ko, Seoul (KR); Yongnam Park, Seoul (KR); Sungeun Yang, Seoul (KR); Deogjin Lee, Seoul (KR)

(73) Assignee: LG ELECTRONICS, INC, Seoul (KR)

( * ) Notice: Subject to any disclaimer, the term of this patent is extended or adjusted under 35 U.S.C. 154(b) by 0 days.

(21) Appl. No.: 16/965,239

(22) PCT Filed: Jul. 4, 2018

(86) PCT No.: PCT/KR2018/007543
§ 371 (c)(1),
(2) Date: Jul. 27, 2020

(87) PCT Pub. No.: WO2019/212089
PCT Pub. Date: Nov. 7, 2019

(65) Prior Publication Data
US 2020/0359120 A1 Nov. 12, 2020

(30) Foreign Application Priority Data

May 3, 2018 (KR) .......................... 10-2018-0051300
Jul. 3, 2018 (KR) .......................... 10-2018-0076914

(51) Int. Cl.
*G06F 3/041* (2006.01)
*H04R 1/02* (2006.01)
(Continued)

(52) U.S. Cl.
CPC ............. *H04R 1/028* (2013.01); *G06F 3/041* (2013.01); *H01L 27/323* (2013.01);
(Continued)

(58) Field of Classification Search
CPC combination set(s) only.
See application file for complete search history.

(56) References Cited

U.S. PATENT DOCUMENTS

2012/0229407 A1* 9/2012 Harris .................... G06F 3/016
345/173
2015/0341714 A1* 11/2015 Ahn ...................... G06F 1/1688
381/333
2020/0201461 A1* 6/2020 Miyamoto ............ G06F 3/0414

FOREIGN PATENT DOCUMENTS

KR 1020060074900 7/2006
KR 1020120101359 9/2012
(Continued)

OTHER PUBLICATIONS

PCT International Application No. PCT/KR2018/007543, Notification of Transmittal of the International Search Report and the Written Opinion of the International Searching Authority, or Declaration dated Jan. 28, 2019, 14 pages.

*Primary Examiner* — Michael J Jansen II
*Assistant Examiner* — Sosina Abebe
(74) *Attorney, Agent, or Firm* — Lee, Hong, Degerman, Kang & Waimey

(57) ABSTRACT

The present disclosure relates to a display device comprising a display panel which outputs an image on a front surface thereof and is bendable, an exciter positioned on a rear surface of the display panel, for generating sound by vibrating the display panel, a vibration transmitting unit positioned between the exciter and the display panel, for transmitting vibrations of the exciter to the display panel, a control unit for controlling the display panel and the exciter, and a frame to which the display panel is fixed. As the display device uses the bendable display panel, such that the display panel itself can vibrate to output sound, the display (Continued)

device has an advantage in that there is no need to have a separate sound output device.

17 Claims, 8 Drawing Sheets

(51) Int. Cl.
  *H01L 27/32* (2006.01)
  *H01L 51/00* (2006.01)
  *H01L 51/52* (2006.01)
  *H04R 3/00* (2006.01)
  *G06F 3/01* (2006.01)

(52) U.S. Cl.
  CPC ...... *H01L 27/3225* (2013.01); *H01L 27/3244* (2013.01); *H01L 51/0097* (2013.01); *H01L 51/5237* (2013.01); *H04R 3/00* (2013.01); *G06F 3/016* (2013.01); *G06F 2203/04102* (2013.01); *H01L 2251/5338* (2013.01); *H04R 2400/11* (2013.01); *H04R 2499/15* (2013.01)

(56) References Cited

FOREIGN PATENT DOCUMENTS

| KR | 1020150133918 | 12/2015 |
| KR | 1020170069530 | 6/2017 |
| KR | 1020170135673 | 12/2017 |

* cited by examiner

FIG. 4
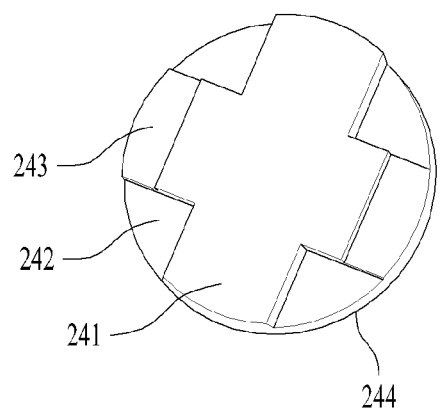
(a)
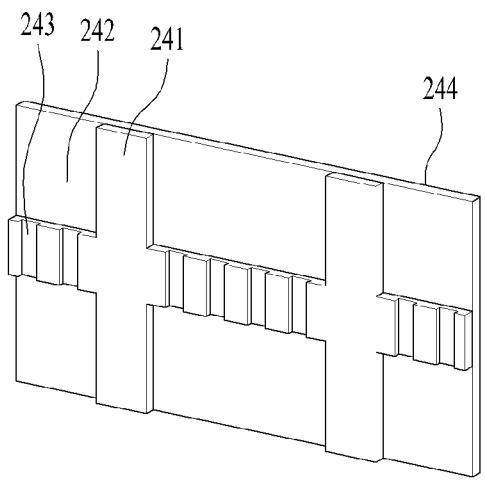
(b)
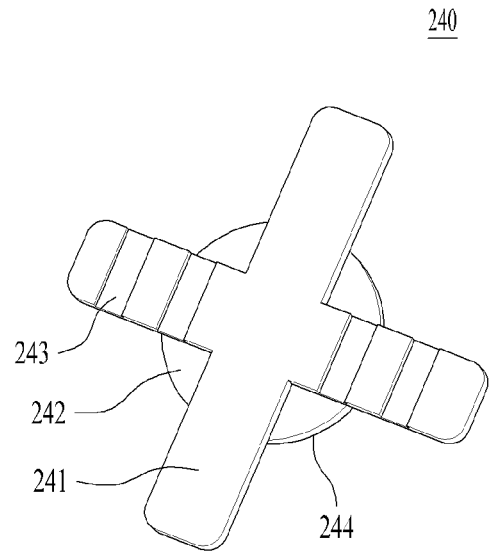
(c)

DISPLAY DEVICE

CROSS-REFERENCE TO RELATED APPLICATIONS

This is the National Stage filing under 35 U.S.C. 371 of International Application No. PCT/KR2018/007543, filed on Jul. 4, 2018, which claims the benefit of earlier filing date and right of priority to Korean Application Nos. 10-2018-0051300, filed on May 3, 2018, and 10-2018-0076914, filed on Jul. 3, 2018, the contents of which are all incorporated by reference herein in their entirety.

TECHNICAL FIELD

The present disclosure relates to a display device provided with an exciter on a rear surface of a display panel to output sound by vibrating a display panel without a separate sound output unit.

BACKGROUND ART

Recently, instead of a hardware medium such as signboard or poster for outdoor advertisements, a display device provides various contents and messages. With the rapid development of an intelligent digital video device based on LED and OLED, needs for a large-sized display device are recently increasing.

Particularly, a video wall in which a display panel is implemented in a lattice arrangement to implement a large-sized display device is used in a wide place, such as an exhibition center or an event hall, which needs a large-sized screen, or is used for outdoor advertisements.

The video wall is referred to as a multi-vision, and may implement a large-sized screen by using a small-sized display panel, whereby a manufacturing cost of the display device may be reduced. Also, the video wall has an advantage in that its disassembly and assembly may easily be performed when the video wall is temporarily arranged or its position and arrangement should be changed if necessary.

Recently, since a material such as LED or OLED self-emits light without a backlight structure on a rear surface, a display panel which is flexible may be implemented, whereby a curved display device may be implemented.

DISCLOSURE

Technical Problem

An object of the present disclosure is to provide a display device provided with an exciter on a rear surface of a display panel to output sound by vibrating a display panel without a separate sound output unit.

Technical Solution

A display device is provided, which comprises a display panel having a front surface to which an image is output, and enabling bending deformation; an exciter arranged on a rear surface of the display panel, generating sound by vibrating the display panel; a vibration transfer unit arranged between the exciter and the display panel, transferring vibration of the exciter to the display panel; a controller controlling the display panel and the exciter; and a frame to which the display panel is fixed.

The display device may further comprise a plurality of chips arranged in a first area of the rear surface of the display panel, wherein the vibration transfer unit may include a vibration bracket having a front surface adjoining a second area of the rear surface of the display panel, in which the chips are not formed, and a rear surface adjoining the exciter.

The display panel may be bent in a first direction and fixed to the frame, and the front surface of the vibration bracket further includes a first recessed groove extended in a direction vertical to the first direction.

The front surface of the vibration bracket may include a protrusion adjoining the rear surface of the display panel, in which the chips are not formed, and a second recessed groove recessed so as not to directly adjoin the plurality of chips.

The exciter and the vibration bracket may be provided in a plural number, and the vibration bracket may further include a first vane arranged in the second area and extended in a direction of adjacent vibration brackets.

The vibration bracket may further include a second vane extended to the first vane in a line symmetry direction or point symmetry direction.

The first vane may be connected with a first vane of an adjacent vibration bracket.

The display device may further comprise a rear cover coupled to the rear surface of the display panel, including an opening formed at a position corresponding to the vibration bracket.

The display device may further comprise a fastening magnet attached to an edge of the rear surface of the display panel; and a magnet holder formed on a front surface of the rear cover to correspond to a apposition of the fastening magnet, wherein the display panel may be coupled to the frame by a magnetic force of the fastening magnet.

The display device may further comprise a plurality of heat emission holes formed on the rear surface of the rear cover.

The rear cover may be made of a flexible material.

The vibration transfer unit may include a rubber magnet coupled to the rear surface of the display panel; and a back plate coupled to a rear surface of the rubber magnet by a magnetic force of the rubber magnet, wherein the exciter may be fixed to the back plate.

The back plate may further include aluminum or carbon fiber.

The display device may further comprise a touch sensor arranged on the front surface of the display panel, wherein the controller may drive the exciter if a touch input is sensed by the touch sensor.

The display panel, the exciter and the vibration transfer unit may be provided in a plural number, and the controller may drive each of the plurality of exciters to output each sound.

Advantageous Effects

The display device according to the present disclosure has an advantage in that a separate sound output unit is not required because a display panel which enables bending deformation may be vibrated to output sound.

If a separate sound output unit is provided, sound is output from a side, whereby a direction of the sound is not matched with a direction of an image. However, since the display panel outputs sound, it is advantageous that an output direction of an image is matched with a direction of sound.

Also, if a plurality of display panels are provided, it is advantageous that sound of a plurality of channels may be output.

It will be appreciated by persons skilled in the art that that the effects that could be achieved with the present disclosure are not limited to what has been particularly described hereinabove and other advantages of the present disclosure will be more clearly understood from the following detailed description taken in conjunction with the accompanying drawings.

BRIEF DESCRIPTION OF THE DRAWINGS

FIG. 4 is a view illustrating a display device according to the second embodiment of the present disclosure.

BEST MODE FOR CARRYING OUT THE INVENTION

Description will now be given in detail according to exemplary embodiments disclosed herein, with reference to the accompanying drawings. For the sake of brief description with reference to the drawings, the same or equivalent components may be provided with the same reference numbers, and description thereof will not be repeated. In general, a suffix such as "module" and "unit" may be used to refer to elements or components. Use of such a suffix herein is merely intended to facilitate description of the specification, and the suffix itself is not intended to give any special meaning or function. In the present disclosure, that which is well-known to one of ordinary skill in the relevant art has generally been omitted for the sake of brevity. The accompanying drawings are used to help easily understand various technical features and it should be understood that the embodiments presented herein are not limited by the accompanying drawings. As such, the present disclosure should be construed to extend to any alterations, equivalents and substitutes in addition to those which are particularly set out in the accompanying drawings.

It will be understood that although the terms first, second, etc. may be used herein to describe various elements, these elements should not be limited by these terms. These terms are generally only used to distinguish one element from another.

It will be understood that when an element is referred to as being "connected with" another element, the element can be directly connected with the other element or intervening elements may also be present. In contrast, when an element is referred to as being "directly connected with" another element, there are no intervening elements present.

A singular representation may include a plural representation unless it represents a definitely different meaning from the context.

Terms such as "include" or "has" are used herein and should be understood that they are intended to indicate an existence of several components, functions or steps, disclosed in the specification, and it is also understood that greater or fewer components, functions, or steps may likewise be utilized.

Figure 1:
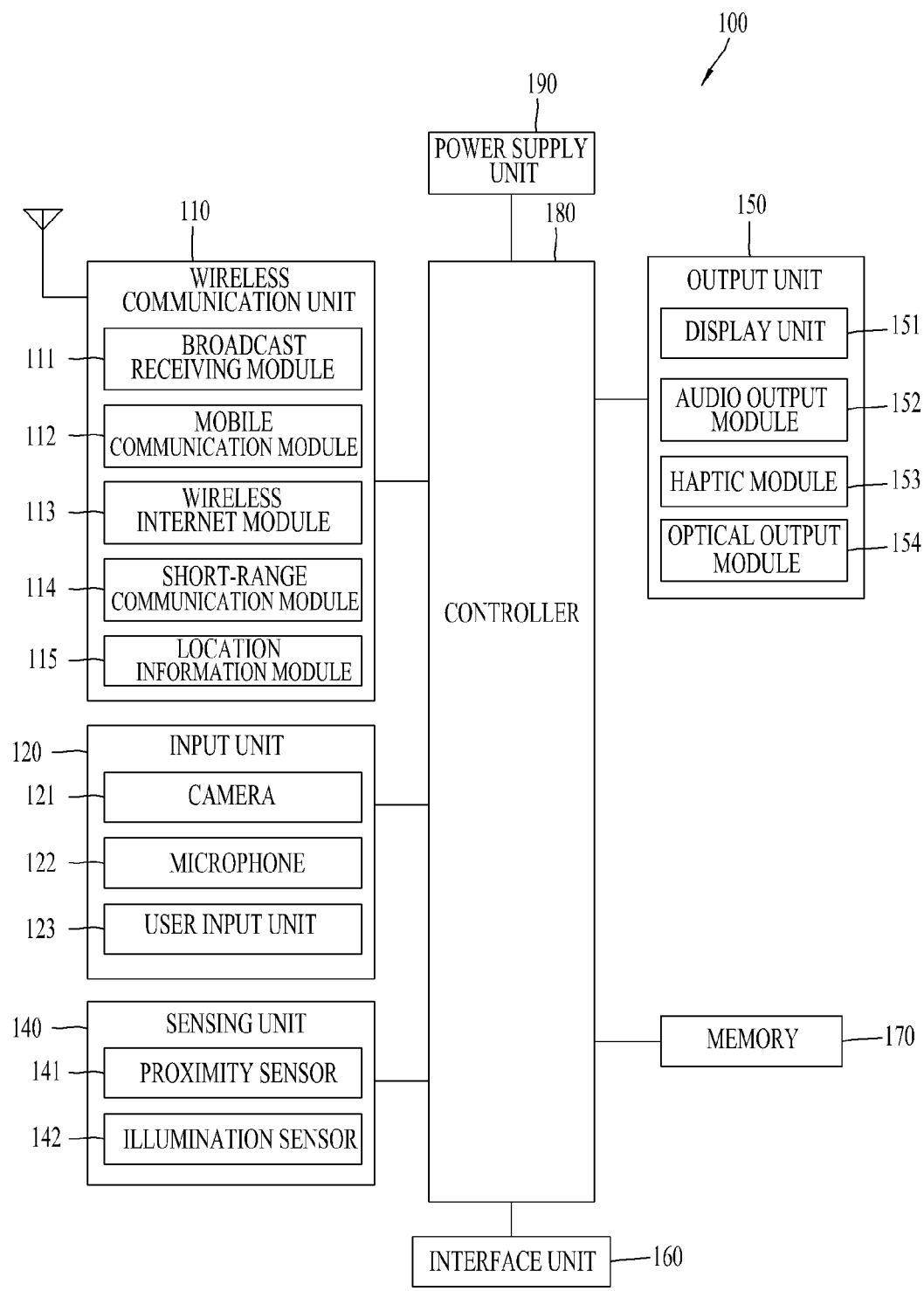
FIG. 1 is a block diagram illustrating a display device according to the present disclosure.

FIG. 1 is a block diagram illustrating a display device 100 according to the present disclosure.

The display device 100 is shown having components such as a wireless communication unit 110, an input unit 120, a sensing unit 140, an output unit 150, an interface unit 160, a memory 170, a controller 180, and a power supply unit 190. Referring now to FIG. 1A, the display device 100 is shown having wireless communication unit 110 configured with several commonly implemented components. It is understood that implementing all of the illustrated components is not a requirement, and that greater or fewer components may alternatively be implemented.

More specifically, the wireless communication unit 110 typically includes one or more modules which permit communications such as wireless communications between the display device 100 and a wireless communication system, communications between the display device 100 and another display device, communications between the display device 100 and an external server. Further, the wireless communication unit 110 typically includes one or more modules which connect the display device 100 to one or more networks.

To facilitate such communications, the wireless communication unit 110 includes one or more of a broadcast receiving module 111, a mobile communication module 112, a wireless Internet module 113, a short-range communication module 114, and a location information module 115.

The input unit 120 includes a camera 121 for obtaining images or video, a microphone 122, which is one type of audio input device for inputting an audio signal, and a user input unit 123 (for example, a touch key, a push key, a mechanical key, a soft key, and the like) for allowing a user to input information. Data (for example, audio, video, image, and the like) is obtained by the input unit 120 and may be analyzed and processed by controller 180 according to device parameters, user commands, and combinations thereof.

The sensing unit 140 is typically implemented using one or more sensors configured to sense internal information of the display device, the surrounding environment of the display device, user information, and the like. For example, the sensing unit 140 may alternatively or additionally include other types of sensors or devices, such as a proximity sensor 141 and an illumination sensor 142, a touch sensor, an acceleration sensor, a magnetic sensor, a G-sensor, a gyroscope sensor, a motion sensor, an RGB sensor, an infrared (IR) sensor, a finger scan sensor, a ultrasonic sensor, an optical sensor (for example, camera 121), a microphone 122, a battery gauge, an environment sensor (for example, a barometer, a hygrometer, a thermometer, a radiation detection sensor, a thermal sensor, and a gas sensor, among others), and a chemical sensor (for example, an electronic nose, a health care sensor, a biometric sensor, and the like), to name a few. The display device 100 may be configured to utilize information obtained from sensing unit 140, and in particular, information obtained from one or more sensors of the sensing unit 140, and combinations thereof.

The output unit 150 is typically configured to output various types of information, such as audio, video, tactile output, and the like. The output unit 150 is shown having a display unit 151, an audio output module 152, a haptic module 153, and an optical output module 154. The display unit 151 may have an inter-layered structure or an integrated structure with a touch sensor in order to facilitate a touch screen. The touch screen may provide an output interface between the display device 100 and a user, as well as function as the user input unit 123 which provides an input interface between the display device 100 and the user.

The interface unit 160 serves as an interface with various types of external devices that can be coupled to the display device 100. The interface unit 160, for example, may include any of wired or wireless ports, external power supply ports, wired or wireless data ports, memory card ports, ports for connecting a device having an identification module, audio input/output (I/O) ports, video I/O ports, earphone ports, and the like. In some cases, the display device 100 may perform assorted control functions associated with a connected external device, in response to the external device being connected to the interface unit 160.

The memory 170 is typically implemented to store data to support various functions or features of the display device 100. For instance, the memory 170 may be configured to store application programs executed in the display device 100, data or instructions for operations of the display device 100, and the like. Some of these application programs may be downloaded from an external server via wireless communication. Other application programs may be installed within the display device 100 at time of manufacturing or shipping, which is typically the case for basic functions of the display device 100 (for example, receiving a call, placing a call, receiving a message, sending a message, and the like). It is common for application programs to be stored in the memory 170, installed in the display device 100, and executed by the controller 180 to perform an operation (or function) for the display device 100.

The controller 180 typically functions to control overall operation of the display device 100, in addition to the operations associated with the application programs. The controller 180 may provide or process information or functions appropriate for a user by processing signals, data, information and the like, which are input or output, or activating application programs stored in the memory 170.

To drive the application programs stored in the memory 170, the controller 180 may be implemented to control a predetermined number of the components mentioned above in reference with FIG. 1A. Moreover, the controller 180 may be implemented to combinedly operate two or more of the components provided in the display device 100 to drive the application programs.

The power supply unit 190 can be configured to receive external power or provide internal power in order to supply appropriate power required for operating elements and components included in the display device 100. The power supply unit 190 may include a battery, and the battery may be configured to be embedded in the terminal body, or configured to be detachable from the terminal body.

Some or more of the components may be operated cooperatively to embody an operation, control or a control method of the display device in accordance with embodiments of the present disclosure. Also, the operation, control or control method of the display device may be realized on the display device by driving of one or more application problems stored in the memory 170.

Figure 2:
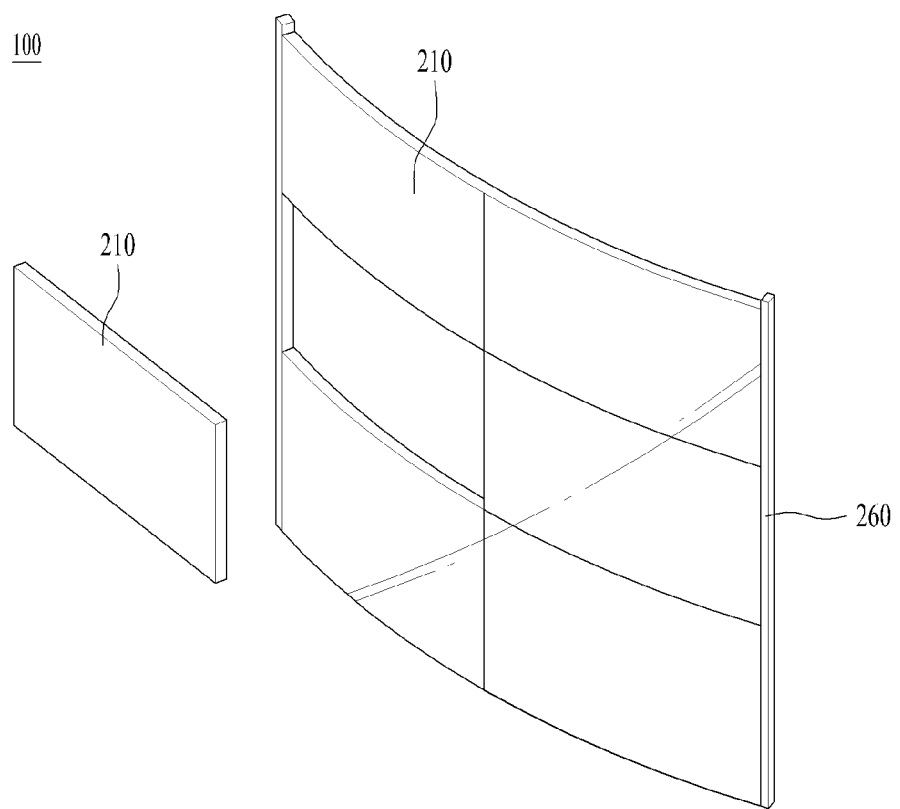
FIG. 2 is a view illustrating a display device according to the present disclosure.

FIG. 2 is a view illustrating a display device according to the present disclosure. In the display device 100 of the present disclosure, a plurality of display panels 210 may be attached to a frame 260 to implement a large-sized screen. Recently, in order that the display device 100 implements a curved screen more advanced than a plane screen, a flexible display panel 210 may be used like Light Emitting Diodes (LEDs) or Organic Light Emitting Diodes (OLEDs).

LCD mainly used in the related art has a difficulty in self-emitting light and thus is supplied with light through a backlight unit. The backlight unit serves to uniformly supply light sources and light supplied from the light sources to a liquid crystal arranged on a front surface. As the backlight unit becomes thin, a thin LCD could be implemented. However, it is difficult to implement a backlight unit made of a flexible material. If the backlight unit is flexible, since it is difficult to uniformly supply light to the liquid crystal, a problem occurs in that brightness of a screen is changed.

On the other hand, in case of LED or OLED, since each of diodes constituting pixels self-emits light, the backlight unit is not required, whereby the LED or OLED may be implemented to be flexible. Also, since each diode self-emits light, even though a position relation between adjacent diodes is changed, the changed position does not affect self-brightness, whereby a flexible display panel 210 may be implemented using LED or OLED.

The OLED display panel 210 has appeared in the middle of 2010 and has rapidly substituted for LCD in small and medium display markets. The OLED is based on self-light emission that emits light if a current flows to a fluorescence organic compound, and has a picture quality reaction speed faster than that of the LCD and thus has almost no residual image when a video is implemented.

The OLED uses three types of fluorescence organic compounds, red, green and blue fluorescence organic compounds each of which has a self-light emission function. Since the OLED is a light emitting type display product based on self-light emission by combination of electrons injected from a cathode and an anode and particles having positive charges in an organism, a backlight unit (rear light unit) that deteriorates color is not required.

The LED display panel 210 uses one LED as one pixel, and since a size of the LED may be more reduced than that of the related art, the flexible LED display panel 210 may be implemented. The device called LED TV in the related art uses LED as a light source of a backlight unit that supplies light to LCD, but the LED fails to configure a screen.

Each LED self-emits light while being independently driven as a red, green or blue pixel. The LED has a high contrast ratio and is more favorable than the LCD of the related art in view of response speed and viewing angle. Also, the LED is excellent in view of brightness, limit resolution, and lifetime. The LED is more excellent than the OLED in view of chemical and mechanical stability and thus may expect a long lifetime. The LED is also excellent in view of brightness and power consumption.

Each display panel 210 may be flexible and thus fixed to the curved frame 260 to implement the curved display device 100. In the curved display device 100, as shown in FIG. 2, the display panel 210 may be attached to the frame 260 of a lattice shape. A fixing method using a fastener such as a screw may be used for coupling between the display panel 210 and the frame 260, or a magnetic force of a magnet may be used for coupling between the display panel 210 and the frame 260.

The flexible display panel 210 of the present disclosure may be vibrated such that the display panel 210 may be used as a sound output unit. An exciter 230 for applying vibration in accordance with a sound signal may be attached to the rear surface of the display panel 210, whereby the display panel 210 may output sound. The exciter 230 is a device that makes vibration on a vibration panel of a speaker. In the present disclosure, the vibration panel may be omitted, and the display panel 210 may be vibrated using the exciter 230 to output sound.

Figure 3A:
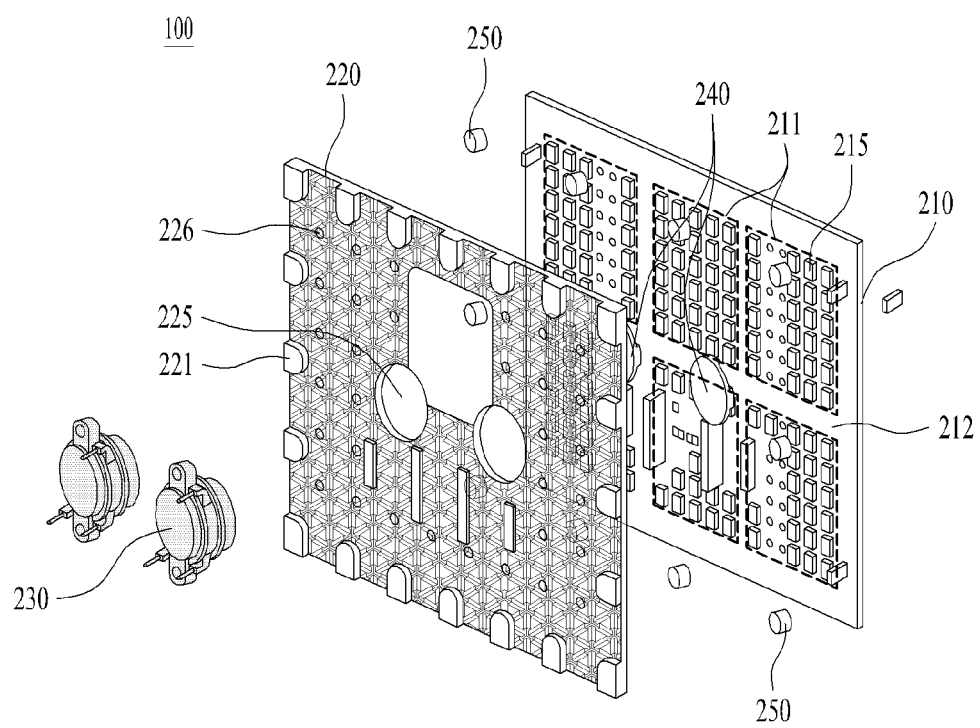
FIG. 3a is a view illustrating a display panel and an exciter of the present disclosure.

FIG. 3a is a view illustrating a display panel 210 and an exciter 230 of the present disclosure. The display panel 210 of this embodiment is an LED panel, and each pixel may be implemented by the LED. The LED outputs a color according to an image signal to operate as the display panel 210.

A plurality of chips 215 for controlling LED may be packaged on the rear surface of the LED display panel 210. An area in which the chips 215 are packaged may be referred to as a first area 211, and an area in which the chips 215 are not packaged may be referred to as a second area 212. The first area 211 may be arranged in the form of a checkerboard, and the second area 212 may be arranged between the first areas 211 in the form of a lattice shape.

In the embodiment shown in FIG. 3a, the rear surface of the display panel 210 includes three first areas 211 on an upper portion and three first areas 211 on a lower portion and the second areas 212 passing between the first areas 211. However, the present disclosure is not limited to the embodiment of FIG. 3a.

The display panel 210 may further include a rear cover to protect the chips 215. If the display panel 210 is flexible, the rear cover should be deformed correspondingly, whereby a deformable material such as silicon or rubber may be used as the rear cover. However, a plurality of heat emission holes 226 may be formed on the rear surface of the rear cover to emit heat.

The exciter 230 attached to the rear surface of the display panel 210 to vibrate the display panel 210 includes a magnet and a coil arranged to adjoin the magnet. If a current is applied to the coil, in an electric field formed by the magnet, an electric field of an opposite direction of the above electric field is formed to move the magnet. Alternatively, the coil moves within the magnetic field formed by the magnet in accordance with a Fleming's left hand law. Using this principle, the exciter 230 makes vibration, and transfers the vibration to the flexible display panel 210, whereby the display panel 210 may be vibrated to output sound. The vibration panel of the sound output unit of the related art is replaced by the flexible display panel 210.

In order that the vibration of the exciter 230 is well transferred to the display panel 210, the exciter 230 is preferably attached to the second area 212, in which the chips 215 are not packaged, on the rear surface of the display panel 210. If vibration is transferred to the rear chips 215 of the display panel 210, the vibration may affect durability of the chip 215, and the vibration of the exciter 230 may be lost.

However, as shown in FIG. 3a, since the size of the exciter 230 is relatively greater than that of the second area 212, a vibration bracket 240 for transferring vibration of the exciter 230 to the display panel 210 may further be provided. The exciter 230 and the vibration bracket 240 may be attached to each other in a single body, or the vibration bracket 240 may be attached to the exciter 230 by an adhesive through injection molding. Since the exciter 230 has a thickness thicker than that of the rear cover, an opening 225 may be formed in the rear cover to correspond to the size of the exciter 230.

Figure 3B:
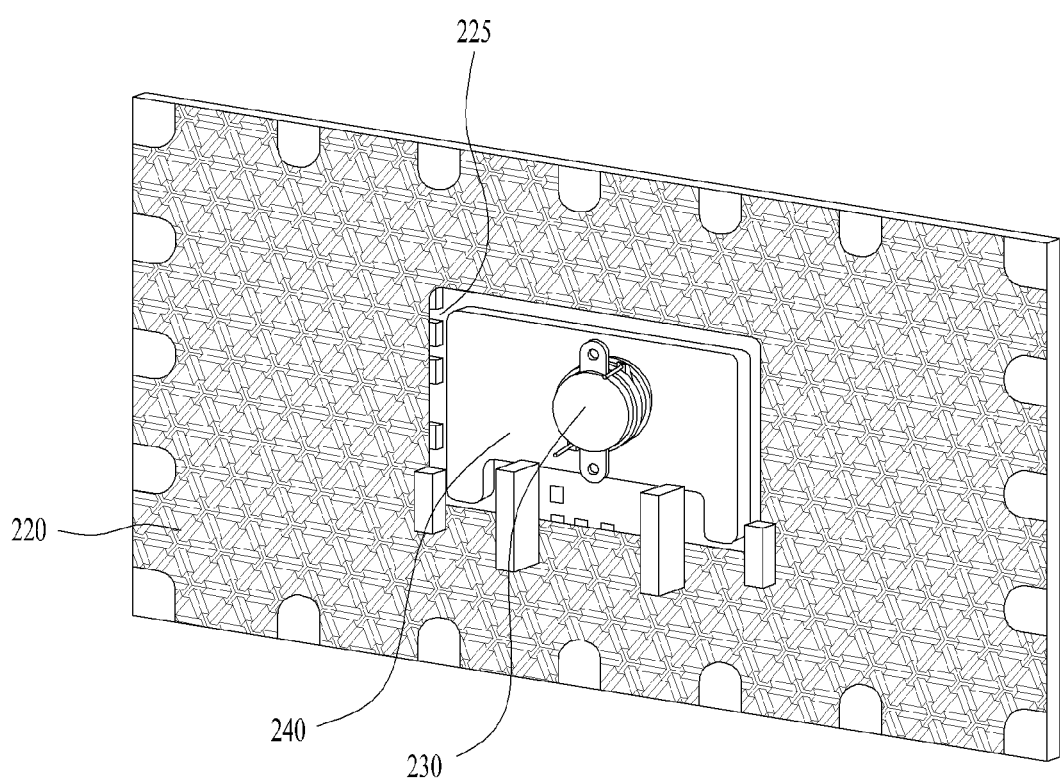
FIG. 3b is a view illustrating a display device according to the first embodiment of the present disclosure.

FIG. 3b is a view illustrating a display device 100 according to another embodiment of the present disclosure. One exciter 230 may be provided in one display panel 210 as shown in FIG. 3b, or a plurality of exciters 230 may be provided as shown in FIG. 3a.

If one exciter 230 is provided as shown in FIG. 3b, the exciter 230 of great output is used. As the size of the exciter 230 becomes great, there may be a difficulty in arrangement of the exciter 230 in the limited second area 212. The size of the vibration bracket 240 also becomes great, and it is difficult to arrange the vibration bracket 240 in only the second area 212 except the first area 211 where the chips 215 are formed.

However, when the plurality of exciters 230 are used as shown in FIG. 3a, vibration between two or more exciters 230 should be matched with another vibration. However, noise may occur due to a distance between the exciters 230, whereby it is required to tune the vibration.

The vibration bracket 240 may have a rectangular shape as shown in FIG. 3b, or may have a circular shape as shown in FIG. 3a. FIG. 4 is a view illustrating an example of a front surface of the vibration bracket 240 according to the present disclosure. FIG. 4(a) illustrates a vibration bracket 240 of FIG. 3a, FIG. 4(b) illustrates a vibration bracket 240 of FIG. 3b, and FIG. 4(c) illustrates a modified example of FIG. 4(a).

The exciter 230 is arranged on the rear surface 244 of the vibration bracket 240. The front surface of the vibration bracket 240 may include a contact portion 241 that adjoins the second area 212 where the chips 215 of the rear surface of the display panel 210 are not formed, and may include a first recessed groove 242 recessed so as not to adjoin the chips 215 of the first area 211. The first recessed groove 242 is formed at a position corresponding to the first area 211, and the contact portion 241 and the first recessed groove 242 are arranged to correspond to the shape of the first areas 211 arranged in a lattice shape and the shape of the second area arranged between the first areas 211 in a cross shape. The vibration bracket 240 may be arranged at a cross shaped intersection point of the second area 212 to widen a width of the contact portion 241 if possible.

When the vibration bracket has a rectangular shape as shown in FIG. 4(b), particularly, when one exciter 230 is used, the size of the vibration bracket 240 becomes great and the area of the vibration bracket 240 overlapped with the first area 211 is increased, whereby a ratio of the first recessed groove 242 is relatively increased.

Referring to FIG. 4(b), in addition to the first recessed groove 242, a second recessed groove 243 may be formed at a portion of the contact portion 241. The second recessed groove 243 is a groove previously formed such that the vibration bracket 240 is able to be deformed to correspond to bending of the display panel 210 when the display panel 210 is bent and coupled to the frame 260. When the display panel 210 is bent in a direction of a long side, the second recessed groove 243 extended to be parallel with a short side of the display panel 210 may be formed. Unlike the first recessed groove 242, since the second recessed groove 243 is arranged in the second area 212, the second recessed groove 243 may be recessed at a depth lower than that of the first recessed groove 242.

Referring to FIG. 4(c), when a plurality of exciters 230 are used, interference between adjacent exciters 230 may occur, whereby noise may occur. Therefore, vanes extended from the vibration bracket 240 may be formed to reduce interference between the adjacent exciters 230. Only one side of the vanes may be extended toward the adjacent brackets 240 but the vanes should have a symmetrical shape to be stably supplied with vibration, whereby the vanes may be extended in a cross shape as shown in FIG. 4(b).

Figure 5:
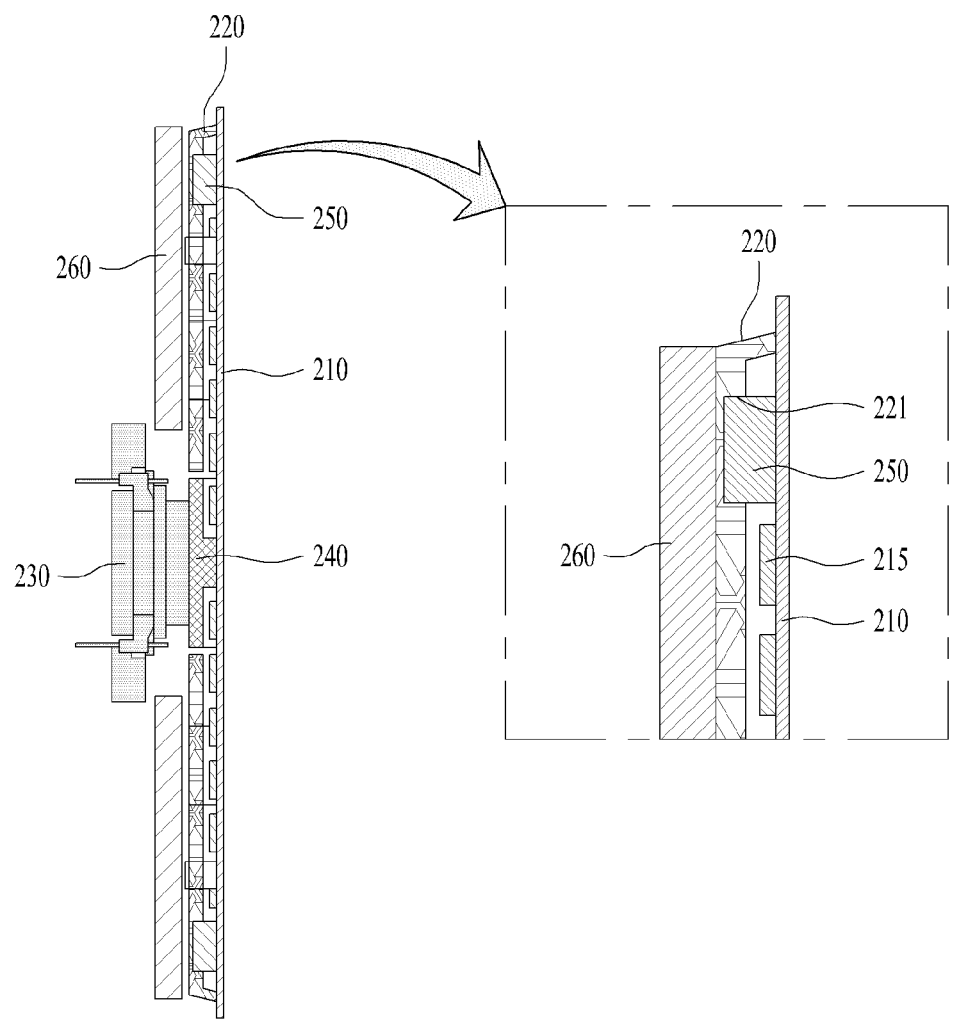
FIG. 5 is a sectional view illustrating a display device according to the present disclosure.

Next, FIG. 5 is a sectional view illustrating a display device 100 according to the present disclosure. As described above, the display device may further include a rear cover to cover the chips 215 arranged on the rear surface of the display panel 210. The second area 212 of the display panel 210 may be arranged even at an end portion of the rear cover such that the end portion of the rear cover may be coupled to the second area. A fastening magnet 250 may further be provided between the rear cover and the display panel 210. The display panel 210 may be coupled to the frame 260 of a metal frame by using magnetism of the fastening magnet 250. As shown in FIG. 3a, a plurality of fastening magnets 250 may be provided along the edge of the display panel 210. A magnet holder 221 corresponding to a shape of the fastening magnet 250 may further be provided on the front surface of the rear cover 220.

Since the thickness of the exciter 230 is thicker than that of the rear cover as shown in FIG. 5, an opening for the exciter 230 may be formed on the rear cover. The vibration bracket 240 arranged on the front surface of the exciter 230 may be coupled to the rear surface of the display panel 210 by using a member having an adhesive component, such as a tape.

Figure 6:
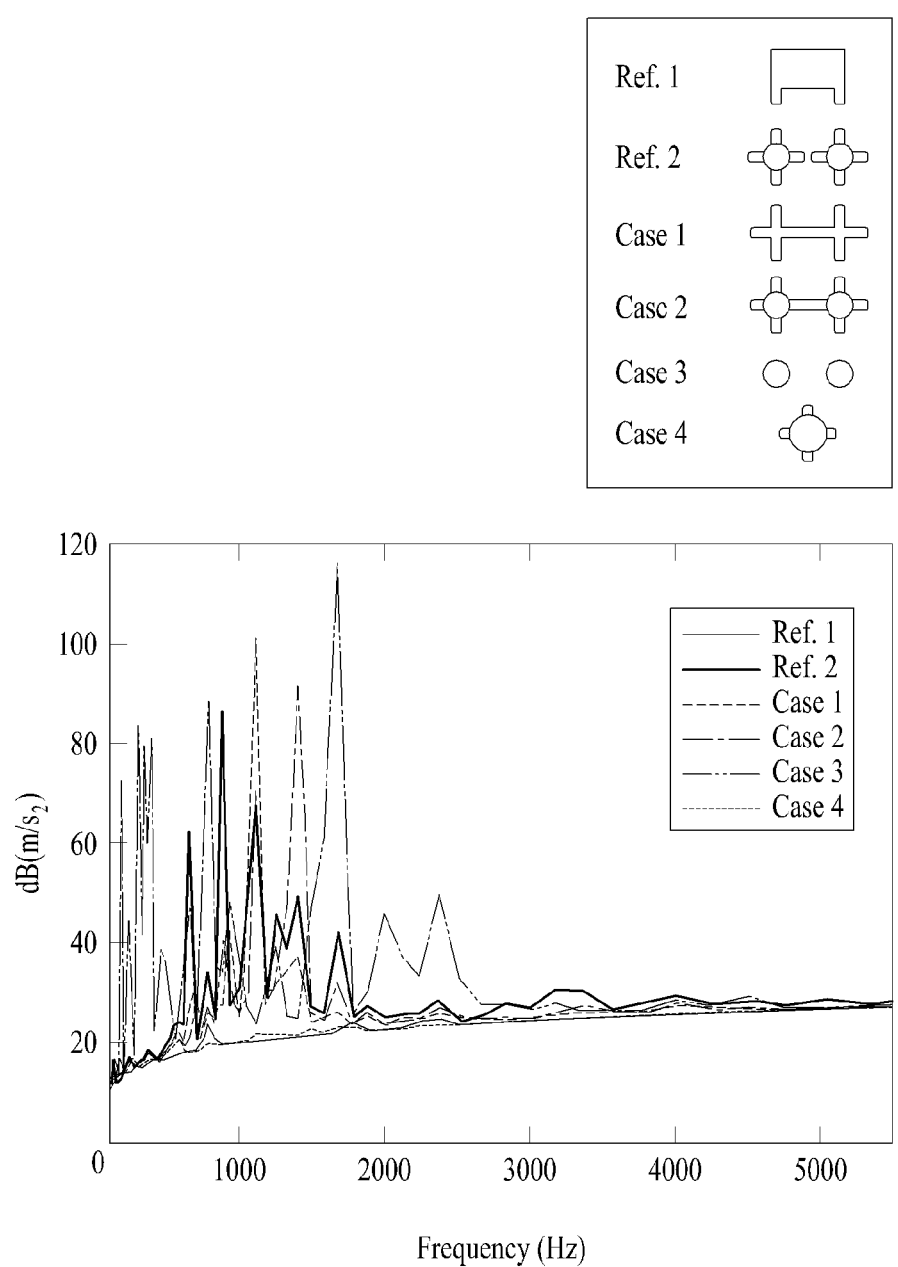
FIG. 6 is a graph illustrating performance based on a shape of a vibration bracket of a display device according to the present disclosure.

FIG. 6 is a graph illustrating performance based on a shape of a vibration bracket 240 of a display device 100 according to the present disclosure. As shown in FIG. 6, various shapes of vibration brackets 240 may be used. Ref 1 and case 4 are vibration brackets for one exciter 230, and Ref 2 and case 1 to case 3 are vibration brackets 240 for two exciters 230. If one vibration bracket 240 is used, relatively uniform vibration performance occurs at most of frequencies but a problem occurs in that the vibration bracket 240 has a small size.

If two or more exciters 230 are used, vibration may occur irregularly due to interference of vibration between the exciters 230. In order to transfer more vibration, vanes further extended along the second area 212 may be provided at the portion where the exciters 230 are arranged. Rear surfaces of the vanes do not directly adjoin the exciters 230, but may transfer vibration to the display panel 210 on the front surface, whereby more vibration may be transferred thereto.

However, in this case, since the size of the vibration bracket 240 is increased, if the display panel 210 is bent and coupled to the frame 260, the vibration bracket 240 is not attached to the display panel 210, whereby a gap may occur. Therefore, the vibration bracket 240 having no vanes may be used like case 3.

Figure 7:
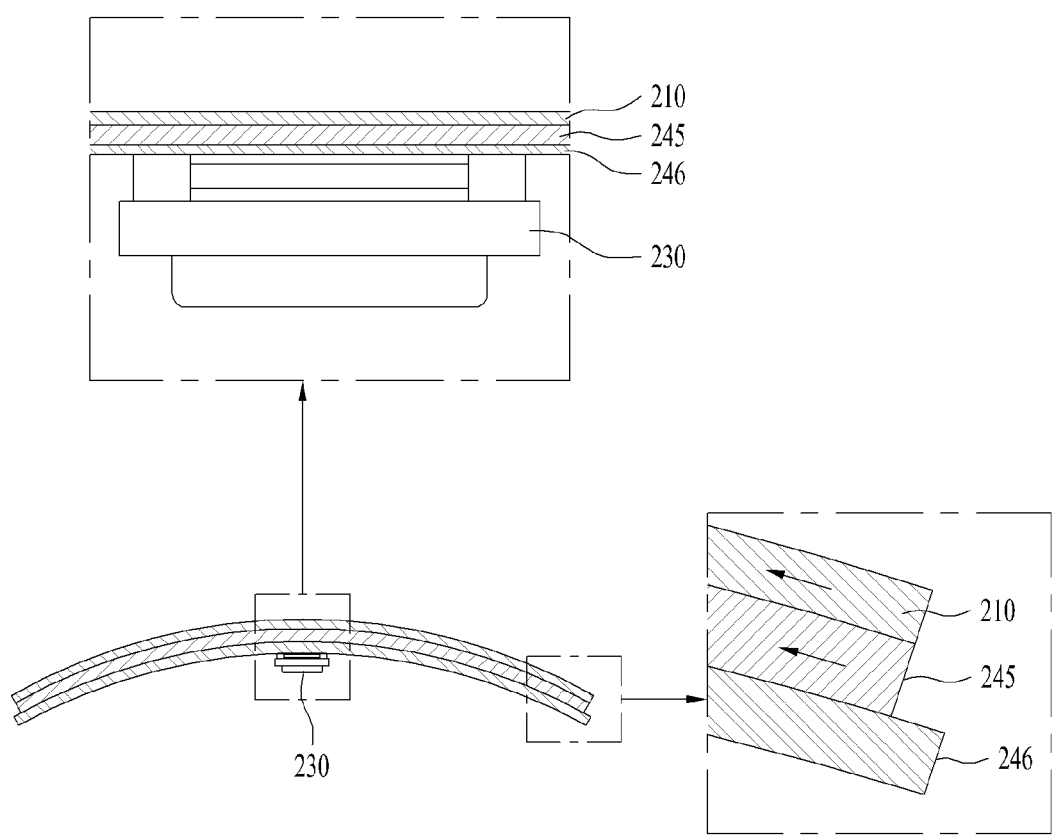
FIG. 7 is a view illustrating a display device according to the third embodiment of the present disclosure.

FIG. 7 is a view illustrating a display device 100 according to the third embodiment of the present disclosure. The display panel 210 of this embodiment includes OLED 210. Since the OLED 210 has no chips on the rear surface, there is restriction in coupling of the exciter 230 to the rear surface of the display panel 210.

Since the OLED 210 is thin, if a force is applied from the rear surface to couple the exciter 230 to the rear surface of the display panel 210, distortion may be formed on the screen of the OLED 210. In order to solve this problem, the exciter 230 may be coupled to the rear surface of the OLED 210 by a back plate 246 without being directly coupled to the rear surface of the OLED 210. The back plate 246 is a plate shaped member of which bending deformation is able to be performed, and supports the OLED 210 on the rear surface of the OLED 210. A material such as aluminum or carbon fiber reinforcing plastic may be used as the back plate 246. Since aluminum or carbon fiber reinforcing plastic has rigidity greater than that of the OLED 210, it may prevent the OLED 210 from being damaged or distorted.

The exciter 230 may be coupled to the rear panel through an adhesive tape or a fastening member, and its vibration may be transferred to the display panel 210 through the rear panel. However, if the exciter 230 is driven for a long time, heat generated from the exciter 230 may be transferred to the display panel 210. In this case, local temperature increase (hot occurrence of spot) occurs in the display panel 210, whereby distortion or color difference of the screen output from the display panel 210 may occur.

If aluminum is used as the back plate 246, heat generated from the exciter 230 may be diffused to remove a hot spot. If the back plate 246 includes a carbon fiber reinforcing plastic, heat transferred to the display panel 210 may be blocked to prevent a hot spot from occurring.

If the back plate 246 is directly attached to the display panel 210, the back plate 246 and the display panel 210 may be detached from each other or the display panel 210 may be damaged due to the attached surface between the back plate 246 and the display panel 210 when the display panel 210 is bent. In order to solve this problem, the display panel 210 and the back plate 246 may be attached to each other by a rubber magnet 245. A soft material such as the OLED 210 may be used as the rubber magnet 245, the rubber magnet 245 may be deformed together with the display panel 210 when the display panel 210 is deformed.

The back plate 246 and the rubber magnet 245 may be coupled with each other by magnetism and are not detached from each other in their coupling direction (direction vertical to a surface) but may be slid in a direction parallel with the surface, whereby the portion between the back plate 246 and the rubber magnet 245 may be slid and bent when the display panel 210 is bent as shown in FIG. 7. In this way, when the portion between the back plate 246 and the rubber magnet 245 is slid and bent, the end portion may prevent the display panel 210 from being damaged as the rubber magnet 245 and the back plate 246 are finely dislocated as shown in FIG. 7.

Also, a touch sensor may further be provided on the front surface of the display panel 210. A user's input may be received in the display panel 210 through the touch sensor, and if the user touches the display panel, haptic vibration corresponding to the user's touch may be provided through driving of the exciter. For example, if a user touches a drum displayed on the display panel 210 with his/her hand, vibration generated by such a touch may be transferred to the user, whereby sound and vibration such as actual hitting a drum may be transferred to the user.

As shown in FIG. 2, the display device of the present disclosure may be implemented in such a manner that the plurality of display panels may be arranged in various ways. Since each of the plurality of touch panels may be provided with an exciter, stereo sound having a plurality of channels may be provided through an output of sound from the exciter.

The display device of the present disclosure does not need a separate sound output unit because a display panel which enables bending deformation may be vibrated to output sound.

If a separate sound output unit is provided, sound is output from a side, whereby a direction of the sound is not matched with a direction of an image. However, since the display panel outputs sound, it is advantageous that an output direction of an image is matched with a direction of sound.

Also, if a plurality of display panels are provided, it is advantageous that sound of a plurality of channels may be output.

It will be apparent to those skilled in the art that the present disclosure can be embodied in other specific forms without departing from the spirit and essential characteristics of the specification. Thus, the above embodiments are to be considered in all respects as illustrative and not restrictive. The scope of the specification should be determined by reasonable interpretation of the appended claims and all change which comes within the equivalent scope of the specification are included in the scope of the specification.

What is claimed is:

1. A display device comprising:
a display panel having a front surface to which an image is output and a rear surface having a first area and a second area, and configured to enable bending deformation;
a plurality of chips arranged in the first area of the rear surface of the display panel;
an exciter arranged on a rear surface of the display panel, and configured to generate sound by vibrating the display panel;
a vibration transfer unit arranged between the exciter and the display panel, and configured to transfer vibration of the exciter to the display panel,
wherein the vibration transfer unit includes a vibration bracket having a front surface adjoining the second area of the rear surface of the display panel, in which the chips are not formed, and a rear surface adjoining the exciter, and
wherein the front surface of the vibration bracket includes a protrusion adjoining the rear surface of the display panel, in which the chips are not formed, and a recessed groove recessed so as not to directly adjoin the plurality of chips;
a controller configured to control the display panel and the exciter; and
a frame to which the display panel is fixed.

2. The display device of claim 1, wherein the display panel is bent in a first direction and fixed to the frame, and the front surface of the vibration bracket further includes a second recessed groove extended in a direction vertical to the first direction.

3. The display device of claim 1, wherein the exciter and the vibration bracket are provided in a plural number, and the vibration bracket further includes a first vane arranged in the second area and extended in a direction of adjacent vibration brackets.

4. The display device of claim 3, wherein the vibration bracket further includes a second vane extended to the first vane in a line symmetry direction or point symmetry direction.

5. The display device of claim 3, wherein the first vane is connected with a first vane of an adjacent vibration bracket.

6. The display device of claim 1, further comprising a rear cover coupled to the rear surface of the display panel, including an opening formed at a position corresponding to the vibration bracket.

7. The display device of claim 6, further comprising:
a fastening magnet attached to an edge of the rear surface of the display panel; and
a magnet holder formed on a front surface of the rear cover to correspond to a apposition of the fastening magnet,
wherein the display panel is coupled to the frame by a magnetic force of the fastening magnet.

8. The display device of claim 6, further comprising a plurality of heat emission holes formed on a rear surface of the rear cover.

9. The display device of claim 6, wherein the rear cover includes a flexible material.

10. The display device of claim 1, wherein the vibration transfer unit further includes:

a rubber magnet coupled to the rear surface of the display panel; and
a back plate coupled to a rear surface of the rubber magnet by a magnetic force of the rubber magnet,
wherein the exciter is fixed to the back plate.

11. The display device of claim 10, wherein the back plate further includes aluminum or carbon fiber.

12. The display device of claim 1, further comprising a touch sensor arranged on the front surface of the display panel, wherein the controller is further configured to drive the exciter if a touch input is sensed by the touch sensor.

13. The display device of claim 1, wherein the display panel, the exciter and the vibration transfer unit are provided in a plural number, and the controller is further configured to drive each of the plurality of exciters to output each sound.

14. A display device comprising:
a display panel having a front surface to which an image is output and a rear surface having a first area and a second area, and configured to enable bending deformation;
a plurality of chips arranged in the first area of the rear surface of the display panel;
an exciter arranged on a rear surface of the display panel, and configured to generate sound by vibrating the display panel;
a vibration transfer unit arranged between the exciter and the display panel, and configured to transfer vibration of the exciter to the display panel,
wherein the vibration transfer unit includes a vibration bracket having a front surface adjoining the second area of the rear surface of the display panel, in which the chips are not formed, and a rear surface adjoining the exciter;
a controller configured to control the display panel and the exciter; and
a frame to which the display panel is fixed,
wherein the display panel is bent in a first direction and fixed to the frame, and the front surface of the vibration bracket includes a recessed groove extended in a direction vertical to the first direction.

15. A display device comprising:
a display panel having a front surface to which an image is output and a rear surface having a first area and a second area, and configured to enable bending deformation;
a plurality of chips arranged in the first area of the rear surface of the display panel;
an exciter arranged on a rear surface of the display panel, and configured to generate sound by vibrating the display panel;
a vibration transfer unit arranged between the exciter and the display panel, and configured to transfer vibration of the exciter to the display panel,
wherein the vibration transfer unit includes a vibration bracket having a front surface adjoining the second area of the rear surface of the display panel, in which the chips are not formed, and a rear surface adjoining the exciter;
a controller configured to control the display panel and the exciter; and
a frame to which the display panel is fixed,
wherein the exciter and the vibration bracket are provided in a plural number, and the vibration bracket further includes a first vane arranged in the second area and extended in a direction of adjacent vibration brackets.

16. The display device of claim 15, wherein the vibration bracket further includes a second vane extended to the first vane in a line symmetry direction or point symmetry direction.

17. The display device of claim 15, wherein the first vane is connected with a first vane of an adjacent vibration bracket.

* * * * *